US012796096B2

(12) United States Patent
Wu et al.

(10) Patent No.: US 12,796,096 B2

(45) Date of Patent: Nov. 10, 2026

(54) DISPLAY DEVICE

(71) Applicant: AUO Corporation, Hsin-Chu (TW)

(72) Inventors: Chia-En Wu, Hsin-Chu (TW); Ming-Hsien Lee, Hsin-Chu (TW); Shu-Han Chang, Hsin-Chu (TW); Wan-Wei Yu, Hsin-Chu (TW); Chang-Hung Li, Hsin-Chu (TW); Shu-Kai Hung, Hsin-Chu (TW); Bo-Ru Jian, Hsin-Chu (TW); Chieh-Ming Chen, Hsin-Chu (TW); Kuo-Hsuan Huang, Hsin-Chu (TW)

(73) Assignee: AUO CORPORATION, Hsin-Chu (TW)

(*) Notice: Subject to any disclaimer, the term of this patent is extended or adjusted under 35 U.S.C. 154(b) by 433 days.

(21) Appl. No.: 18/520,593

(22) Filed: Nov. 28, 2023

(65) Prior Publication Data

US 2024/0429248 A1 Dec. 26, 2024

(30) Foreign Application Priority Data

Jun. 21, 2023 (TW) ................................ 112123504

(51) Int. Cl.

*H10D 86/60* (2025.01)
*H10D 86/40* (2025.01)
*H10W 80/00* (2026.01)
*H10W 90/00* (2026.01)

(52) U.S. Cl.

CPC ........... *H10D 86/60* (2025.01); *H10D 86/451* (2025.01); *H10W 90/00* (2026.01); *H10D 86/441* (2025.01)

(58) Field of Classification Search

CPC ................ H10D 86/60; H10D 86/451; H10K 59/17–1795

See application file for complete search history.

(56) References Cited

U.S. PATENT DOCUMENTS

2014/0268780 A1* 9/2014 Wang .................... H05K 1/028 362/249.06
2021/0020618 A1 1/2021 Hsu
2021/0091260 A1 3/2021 Ogawa
2022/0115572 A1 4/2022 Yang et al.
2024/0332459 A1* 10/2024 Choi ................. H10H 20/8316

FOREIGN PATENT DOCUMENTS

TW 202125666 A 7/2021

* cited by examiner

*Primary Examiner* — Leonard Chang
*Assistant Examiner* — Dzung T Hoang
(74) *Attorney, Agent, or Firm* — WPAT, PC

(57) ABSTRACT

A display device includes light-emitting elements disposed on an array substrate. The array substrate includes a substrate, switch elements disposed on the substrate, an insulating layer, a connecting layer, a conductive layer and a spacer layer. The insulating layer is disposed on the switching elements and has through holes. The connecting layer is disposed on the insulating layer and is electrically connected to the switching elements through the through holes. The conductive layer is disposed on the connecting layer and includes pads electrically connected to the connecting layer. The spacer layer disposed between the connecting layer and the conductive layer. The conductive layer extends on the spacer layer and is orthographically projected on the substrate to form a first orthographic projection area, where the through holes are located in the first orthographic projection.

15 Claims, 4 Drawing Sheets

DISPLAY DEVICE

CROSS-REFERENCE TO RELATED APPLICATION

This application claims priority to Taiwan Application Serial Number 112123504, filed Jun. 21, 2023, which is herein incorporated by reference in its entirety.

BACKGROUND

Field of Invention

The present disclosure relates to a display device. More particularly, the present disclosure relates to a display device including a spacer layer and a conductive layer, where the conductive layer extends on the spacer layer.

Description of Related Art

Micro LED displays have the advantages of power saving, high efficiency, high brightness and fast response time. In order to realize mass transfer, a current approach is to solder the micro LEDs to the array substrate by heating the solder with laser. However, the above-mentioned approach is prone to laser damage at the circuit connections between different layers on the array substrate, resulting in cracks of the circuit connection layer, causing the micro LEDs fail to light up, and then dark spots occur, which in turn reduces the yield.

SUMMARY

At least one embodiment of the present disclosure provides a display device, which can help to reduce the chance of laser damage at the circuit connections on the array substrate, thereby improving the yield.

The display device according to at least one embodiment of the present disclosure includes light emitting elements and an array substrate. The light emitting elements are disposed on the array substrate. The array substrate includes a substrate, switching elements, a first insulating layer, a wiring layer, a second insulating layer, a connecting layer, a third insulating layer, a conductive layer, an upper insulating layer and a spacer layer. The switching elements are disposed on the substrate, and each of the switching elements includes a source electrode and a drain electrode. The first insulating layer is disposed on the source electrodes and the drain electrodes and has first through holes. The wiring layer is disposed on the first insulating layer and connected to the switching elements through the first through holes. The second insulating layer is disposed on the wiring layer and has second through holes. The connecting layer is disposed on the second insulating layer and connected to the wiring layer through the second through holes. The third insulating layer is disposed on the connecting layer and has third through holes. The conductive layer is disposed on the third insulating layer and has pads connected to the connecting layer through the third through holes. The upper insulating layer is disposed on the pads and has connecting vias. The light emitting elements are disposed on the upper insulating layer and electrically connected to the pads through the connecting vias, and the light emitting elements are electrically connected to the switching elements. The spacer layer is disposed between the third insulating layer and the conductive layer. The conductive layer extends on the spacer layer. The conductive layer is orthogonally projected on the substrate to form a first orthographic projection area, and the second through holes are located in the first orthographic projection area.

The display device according to at least another embodiment of the present disclosure includes light emitting elements and an array substrate. The light emitting elements are disposed on the array substrate. The array substrate includes a substrate, switching elements, an insulating layer, a connecting layer, a conductive layer and a spacer layer. The switching elements are disposed on the substrate. The insulating layer is disposed on the switching elements and has through holes. The connecting layer is disposed on the insulating layer and electrically connected to the switching elements through the through holes. The conductive layer is disposed on the connecting layer and has pads connected to the connecting layer, and the light emitting elements are electrically connected to the pads to electrically connect to the switching elements. The spacer layer is disposed between the connecting layer and the conductive layer. The conductive layer extends on the spacer layer. The conductive layer is orthogonally projected on the substrate to form a first orthographic projection area, and each of the light emitting elements is orthogonally projected on the substrate to form a second orthographic projection area. The through holes are located in the first orthographic projection area and not located in the second orthographic projection areas.

DETAILED DESCRIPTION

Figure 1:
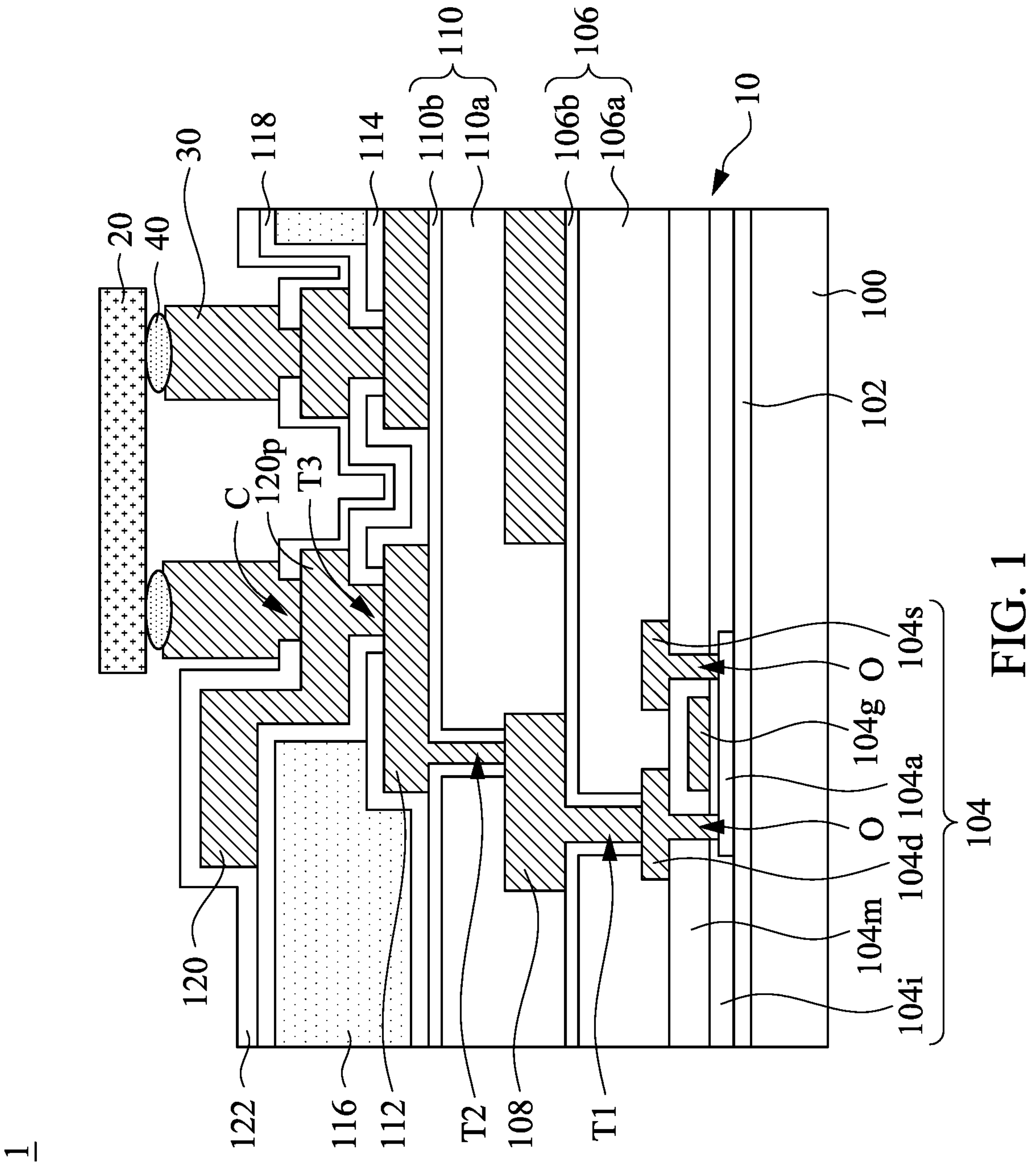
FIG. 1 is a schematic cross-sectional view of a display device according to at least one embodiment of the present disclosure.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Furthermore, the words “about”, “approximately” or “substantially” used in the present disclosure not only cover the clearly stated numerical values and numerical ranges, but also cover those that can be understood by a person with ordinary knowledge in the technical field to which the present disclosure belongs. The permissible deviation range can be determined by the error generated during measurement, and the error is caused, for example, by limitations of the measurement system or process conditions. For example, two objects (such as the plane or traces of a substrate) are "substantially parallel" or "substantially perpendicular," where "substantially parallel" and "substantially perpendicular," respectively, mean that parallelism and perpendicularity between the two objects can include non-parallelism and non-perpendicularity caused by permissible deviation ranges.

In addition, "about" may mean within one or more standard deviations of the above values, such as within ±30%, 20%, 10%, or ±5%. Such words as "about", "approximately", or "substantially" as appearing in the present disclosure may be used to select an acceptable range of deviation or standard deviation according to optical properties, etching properties, mechanical properties, or other properties, rather than applying all of the above optical properties, etching properties, mechanical properties, and other properties with a single standard deviation.

The spatial relative terms used in the present disclosure, such as "below," "under," "above," "on," and the like, are intended to facilitate the recitation of a relative relationship between one element or feature and another as depicted in the drawings. The true meaning of these spatial relative terms includes other orientations. For example, the relationship between one element and another may change from "below" and "under" to "above" and "on" when the drawing is turned 180 degrees up or down. In addition, spatially relative descriptions used in the present disclosure should be interpreted in the same manner.

It should be understood that while the present disclosure may use terms such as "first", "second", "third" to describe various elements or features, these elements or features should not be limited by these terms. These terms are primarily used to distinguish one element from another, or one feature from another. In addition, the term "or" as used in the present disclosure may include, as appropriate, any one or a combination of the listed items in association.

Moreover, the present disclosure may be implemented or applied in various other specific embodiments, and the details of the present disclosure may be combined, modified, and altered in various embodiments based on different viewpoints and applications, without departing from the idea of the present disclosure.

FIG. 1 is a schematic cross-sectional view of a display device according to at least one embodiment of the present disclosure. Referring to FIG. 1, the display device 1 includes light emitting elements 20 and an array substrate 10, where the light emitting elements 20 are disposed on the array substrate 10. The array substrate 10 includes a substrate 100, switching elements 104, a first insulating layer 106, a wiring layer 108, a second insulating layer 110, a connecting layer 112, a third insulating layer 114, a conductive layer 120, an upper insulating layer 122 and a spacer layer 116. In order to simplify the expression of the drawing, FIG. 1 only shows one light emitting element 20 and one switching element 104 as an example. However, it is understandable that other light emitting elements 20 and other switching elements 104 may also be included in places not shown in the drawing.

As shown in FIG. 1, the switching element 104 is disposed on the substrate 100 and includes a source electrode 104*s* and a drain electrode 104*d*. The first insulating layer 106 is disposed on the source electrode 104*s* and the drain electrode 104*d*, and has first through holes T1. The wiring layer 108 is disposed on the first insulating layer 106 and connected to the switching elements 104 through the first through holes T1. The second insulating layer 110 is disposed on the wiring layer 108 and has second through holes T2. The connecting layer 112 is disposed on the second insulating layer 110 and connected to the wiring layer 108 through the second through holes T2. The third insulating layer 114 is disposed on the connecting layer 112 and has third through holes T3. In order to simplify the expression of the drawing, FIG. 1 only shows one first through hole T1, one second through hole T2 and one third through hole T3 as a representative representation. Other first through holes T1, other second through holes T2 and other third through holes T3 may also be included in places not shown in the drawing.

The conductive layer 120 is disposed on the third insulating layer 114 and has pads 120*p* connected to the connecting layer 112 through the third through holes T3. The upper insulating layer 122 is disposed on the pads 120*p* and has a connecting vias C. The light emitting elements 20 are disposed on the upper insulating layer 122 and electrically connected to the pads 120*p* through the connecting vias C, so that the light emitting elements 20 are electrically connected to the switch elements 104. The spacer layer 116 is disposed between the third insulating layer 114 and the conductive layer 120, and the conductive layer 120 extends on the spacer layer 116.

The conductive layer 120 is orthogonally projected on the substrate 100 to form a first orthographic projection area, and the second through holes T2 are located in the first orthographic projection area. Specifically, the first orthographic projection area is an area where the conductive layer 120 projects onto the substrate 100 along a direction perpendicular to the surface of the substrate 100 (e.g., the upper surface), where the aforementioned direction is, for example, the vertical direction in FIG. 1. As shown in FIG. 1, the area of the second through holes T2 projected on the substrate 100 along the direction perpendicular to the surface of the substrate 100 (for example, the vertical direction in FIG. 1) overlaps with the aforementioned first orthographic projection area, so the second through holes T2 located in the first orthographic projection area. That is, the second through holes T2 overlap the conductive layer 120.

By disposing the second through holes T2 in the orthographic projection area of the conductive layer 120, the conductive layer 120 can shield the second through holes T2 to reduce the chance of the circuit connections in the second through holes T2 being damaged by laser, thereby improving the yield. In addition, by providing the spacer layer 116 and extending the conductive layer 120 on the spacer layer 116, the distance between the conductive layer 120 and the second through holes T2 can be increased to further reduce the chance of the circuit connections in the second through holes T2 being damaged by laser, thereby improving the yield more effectively.

As shown in FIG. 1, the light emitting element 20 is orthogonally projected on the substrate 100 to form a second orthographic projection area, where the second through holes T2 are not located in the second orthographic projection areas. The definition of the second orthographic projection area is similar to that of the first orthographic projection. That is, the second orthographic projection area is the area where the light emitting element 20 projects onto the substrate 100 along a direction perpendicular to the surface of the substrate 100 (e.g., the vertical direction in FIG. 1). Due to circuit design requirements, the second through holes T2 are not located in the orthographic projection areas of the light emitting elements 20, and the second through holes T2 are disposed in the orthographic projection area of the conductive layer 120, so that the conductive layer 120 shields the second through holes T2 to reduce the chance of the circuit connections in the second through holes T2 being damaged by laser, and thus improve the yield.

In some embodiments, the first through holes T1 are also disposed in the first orthographic projection area, that is, located in the orthographic projection area of the conductive layer 120. By disposing the first through holes T1 in the orthographic projection area of the conductive layer 120, the conductive layer 120 can shield the first through holes T1 to reduce the chance of the circuit connections in the first through holes T1 being damaged by laser, thereby improving the yield.

In some embodiments, the first through holes T1 are also not located in the second orthographic projection areas, that is, they are not located in the orthographic projection areas of the light emitting elements 20. Due to circuit design requirements, the first through holes T1 are not located in the orthographic projection areas of the light emitting elements 20, and the first through holes T1 are disposed in the orthographic projection area of the conductive layer 120, so that the conductive layer 120 shields the first through holes T1 to reduce the chance of the circuit connections in the first through holes T1 being damaged by laser, thereby improving the yield more effectively.

Referring to FIG. 1, the display device 1 further includes a buffer layer 102, a protective layer 118, soldering pads 30 and solders 40. The buffer layer 102 is disposed between the substrate 100 and the switching element 104. The protective layer 118 is disposed between the spacer layer 116 and the conductive layer 120, so that the conductive layer 120 is not directly in contact with the spacer layer 116. The soldering pads 30 are disposed on the upper insulating layer 122 and connected to the pads 120$p$ through the connecting vias C. The light emitting element 20 is connected to the soldering pads 30 through the solders 40 disposed thereon, and then is electrically connected to the pads 120$p$ to electrically connect to the switching element 104.

In some embodiments, the sidewall of the spacer layer 116 is located on the third insulating layer 114, where the protective layer 118 is located on the spacer layer 116 and covers the sidewall of the spacer layer 116, and further extends on the third insulating layer 114 and the third through hole T3 to cover the sidewall of the third insulating layer 114. By the aforementioned structural design, moisture penetration into the display device 1 can be blocked or avoided, thus preventing the light emitting elements 20 and the array substrate 10 from being affected by moisture and failing.

As shown in FIG. 1, the switching element 104 further includes an active layer 104$a$, a gate insulating layer 104$i$, a gate electrode 104$g$ and an interlayer insulating layer 104$m$. The active layer 104$a$ is disposed on the buffer layer 102. The gate insulating layer 104$i$ is disposed on the active layer 104$a$. The gate electrode 104$g$ is disposed on the gate insulating layer 104$i$. The interlayer insulating layer 104$m$ is disposed on the gate electrode 104$g$ and has openings O passing through the gate insulating layer 104$i$, so that the source electrode 104$s$ and the drain electrode 104$d$ are connected to the active layer 104$a$ through the openings O. In this embodiment, the gate electrode 104$g$ is disposed on the active layer 104$a$ to form a top-gate thin film transistor, but is not limited thereto. In other embodiments, the gate electrode 104$g$ may be disposed under the active layer 104$a$ to form a bottom-gate thin film transistor.

In some embodiments, the openings O are also not located in the second orthographic projection areas, that is, they are not located in the orthographic projection areas of the light emitting elements 20. Due to circuit design requirements, the openings O are not located in the orthographic projection areas of the light emitting element 20, and the openings O are disposed in the orthographic projection area of the conductive layer 120, so that the conductive layer 120 shields the openings O to reduce the chance of the circuit connections in the openings O being damaged by laser, thereby improving the yield more effectively.

Referring to FIG. 1, the first insulating layer 106 and the second insulating layer 110 respectively include organic sub-layers 106$a$, 110$a$ and inorganic sub-layers 106$b$, 110$b$, where the inorganic sub-layers 106$b$, 110$b$ are respectively disposed on the organic sub-layers 106$a$, 110$a$. In some embodiments, the sidewalls of the organic sub-layers 106$a$, 110$a$ are respectively located on the drain electrode 104$d$ and the wiring layer 108, where the inorganic sub-layers 106$b$, 110$b$ are respectively located on the organic sub-layers 106$a$, 110$a$ and cover the sidewalls of the organic sub-layers 106$a$, 110$a$, and further extend into the first through hole T1 and the second through hole T2. By the aforementioned structural design, moisture penetration into the display device 1 can be blocked or avoided, thus preventing the light emitting elements 20 and the array substrate 10 from being affected by moisture and failing.

The substrate 100 may be a transparent substrate or a non-transparent substrate, and the material of the substrate 100 may be quartz, glass, polymer material, or other suitable material. In some embodiments, a deposition process, an inkjet process, a printing process, a coating process, and a photolithography etching process can be used to form the buffer layer 102, the switch element 104, the first insulating layer 106, the wiring layer 108, the second insulating layer 110, the connecting layer 112, the third insulating layer 114, the spacer layer 116, the protective layer 118, the conductive layer 120, and the upper insulating layer 122.

In some embodiments, the soldering pads 30 can be formed on the surface of the pads 120$p$ exposed by the connecting vias C of the upper insulating layer 122 by electroless plating (e.g., chemical plating) process. The material of the soldering pads 30 can include nickel-gold alloy. The material of the solders 40 may include metals suitable for eutectic soldering, such as tin, indium and bismuth, so as to form eutectic bond with the soldering pads 30 by laser.

The material of the active layer 104$a$ of the switch element 104 may include silicon semiconductor material (such as polycrystalline silicon and amorphous silicon), oxide semiconductor material or organic semiconductor material. The materials of the wiring layer 108, the connecting layer 112, the conductive layer 120 and the gate electrode 104$g$, the source electrode 104$s$ and the drain electrode 104$d$ of the switch element 104 may include metals with good conductivity, such as aluminum, molybdenum, titanium and copper. The materials of the buffer layer 102, the gate insulating layer 104$i$, the interlayer insulating layer 104$m$, the first insulating layer 106, the second insulating layer 110, the third insulating layer 114, and the upper insulating layer 122 may include transparent insulating materials, such as transparent inorganic insulating materials or transparent organic insulating materials. Inorganic insulating materials such as silicon oxide, silicon nitride and silicon oxynitride. Organic insulating materials such as acrylic, siloxane, polyimide and epoxy resin.

In some embodiments, the materials of the organic sub-layer 106*a* of the first insulating layer 106 and the organic sub-layer 110*a* of the second insulating layer 110 may include transparent organic insulating materials, such as acrylic, siloxane, polyimide and epoxy resin. By disposing the above-mentioned organic insulating material between the metal layers of the switch element 104, the wiring layer 108 and the connecting layer 112 to provide a certain thickness to increasing the flatness, which can also reduce the capacitance between the metal layers, thereby reducing the circuit load of the array substrate 10.

The materials of the inorganic sub-layer 106*b* of the first insulating layer 106 and the inorganic sub-layer 110*b* of the second insulating layer 110 may include transparent inorganic insulating materials, such as silicon oxide, silicon nitride and silicon oxynitride. By disposing the above-mentioned inorganic insulating material on the organic sub-layers 106*a*, 110*a* and covering the sidewalls of the organic sub-layers 106*a*, 110*a*, the moisture absorbed by the organic sub-layers 106*a*, 110*a* can be blocked or avoided from penetrating into the display device 1, thereby preventing the light emitting elements 20 and the array substrate 10 from being affected by moisture and failing.

In some embodiments, the material of the spacer layer 116 may include transparent organic insulating materials or non-transparent organic insulating materials. Transparent organic insulating materials such as acrylic, siloxane, polyimide and epoxy resin. Non-transparent organic insulating materials such as black photoresist or black ink. By disposing the spacer layer 116 formed with the above-mentioned organic insulating material to provide a certain thickness, and the conductive layer 120 extends on the spacer layer 116, the distance between the conductive layer 120 and the second through holes T2 can be increased, so as to further reduce the chance of the circuit connections in the second through holes T2 being damaged by laser, and thus improve the yield more effectively. In addition, the non-transparent organic insulating material such as black photoresist or black ink can be used to shield the metal layers below to avoid unnecessary light reflection and improve the contrast of the display device 1.

In some embodiments, the material of the protective layer 118 may include inorganic insulating materials, such as silicon oxide, silicon nitride and silicon oxynitride. By disposing the above-mentioned inorganic insulating material on the spacer layer 116 and covering the sidewall of the spacer layer 116 so that the conductive layer 120 is not directly in contact with the spacer layer 116, the moisture absorbed by the spacer layer 116 can be blocked or prevented from penetrating into the display device 1, thereby preventing the light emitting elements 20 and the array substrate 10 from being affected by moisture and failing.

The light emitting elements 20 may be light emitting diodes (LEDs), such as sub-millimeter light emitting diodes (mini LEDs) or micro light emitting diodes (micro LEDs, μLEDs). The thickness of the micro light emitting diode is below 10 micrometers, for example 6 micrometers. Sub-millimeter light-emitting diodes can be divided into two types: one contains encapsulant and the other does not contain encapsulant. The thickness of sub-millimeter light emitting diode containing encapsulant can be less than 800 micrometers, and the thickness of sub-millimeter light emitting diode without encapsulant can be less than 100 micrometers. In addition, the light emitting elements 20 can also be large-sized regular LEDs other than sub-millimeter light emitting diodes and micro light emitting diodes, so the light emitting elements 20 are not limited to being sub-millimeter light emitting diodes or micro light emitting diodes of smaller size.

In some embodiments, the light emitting elements 20 are flip-chip type light emitting elements. In detail, as shown in FIG. 1, the light emitting element 20 has an upper surface and a lower surface opposite to the upper surface, and the cathode (not shown), the anode (not shown), and the solders 40 of the light emitting element 20 are disposed on the lower surface of the light emitting element 20, and the upper surface of the light emitting element 20 is the light emitting surface.

Figure 2:
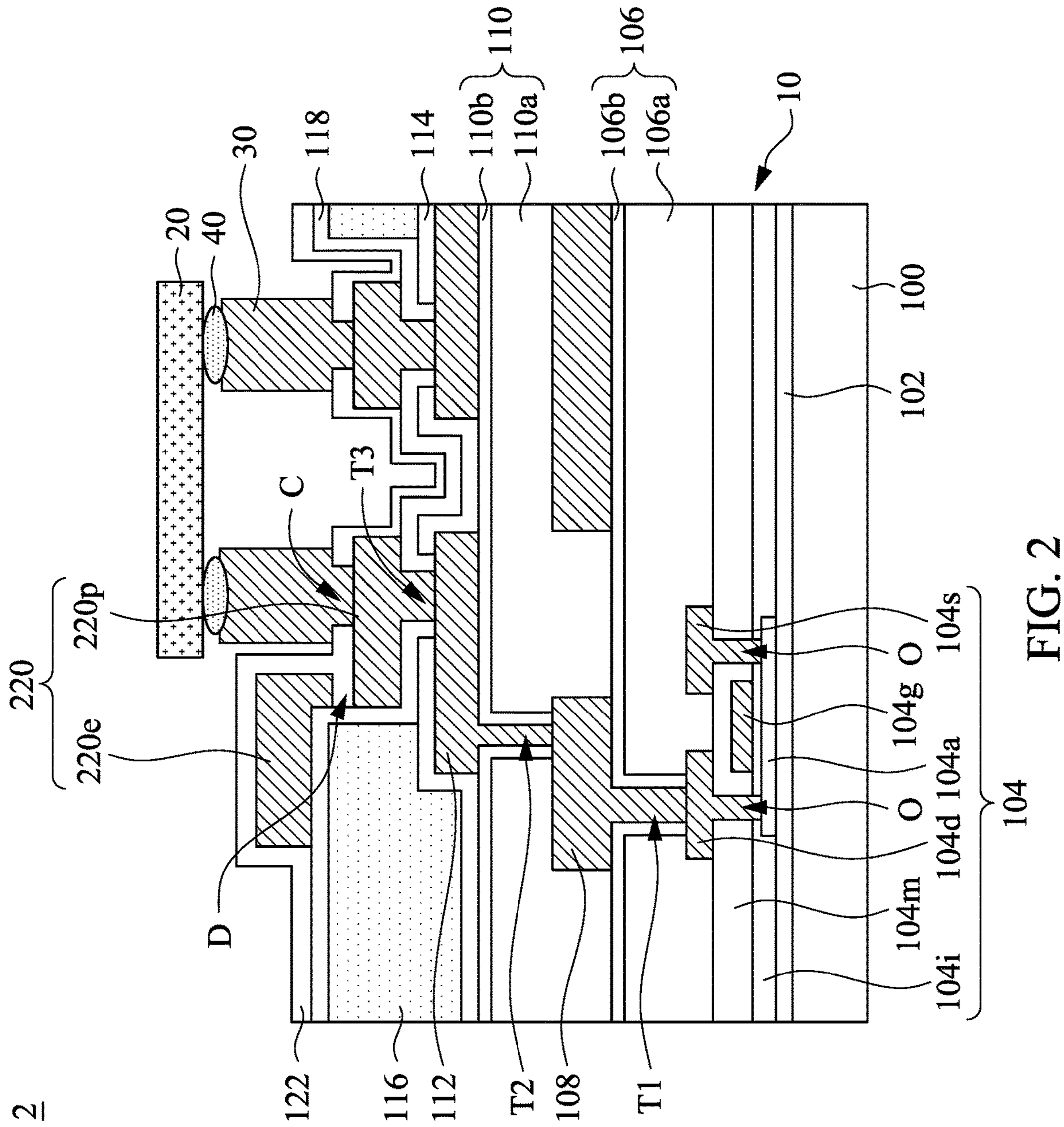
FIG. 2 is a schematic cross-sectional view of a display device according to at least another embodiment of the present disclosure.

FIG. 2 is a schematic cross-sectional view of a display device according to at least another embodiment of the present disclosure. The structures, the materials, the manufacturing processes and the relative positions of most elements in the embodiments of FIG. 2 and FIG. 1 are the same, so the same features are not repeated here. The difference between the embodiments of FIG. 2 and FIG. 1 is that the conductive layer 220 of the display device 2 in FIG. 2 includes not only the pads 220*p*, but also an extending part 220*e*. The pads 220*p* are connected to the connecting layer 112, and the extending part 220*e* is not connected to the connecting layer 112 and separated from the pads 220*p*. In detail, the conductive layer 220 has a disconnection region D located between the pad 220*p* and the extending part 220*e* to separate the pad 220*p* and the extending part 220*e*.

As shown in FIG. 2, the sidewall of the spacer layer 116 is disposed on the third insulating layer 114, the extending part 220*e* is disposed on the spacer layer 116 and further extends to the sidewall of the spacer layer 116, and the pad 220*p* is disposed on the connecting layer 112 and further extends to the sidewall of the spacer layer 116, where the disconnection region D is disposed between the pad 220*p* and the extending part 220*e*, i.e., is disposed on the sidewall of the spacer layer 116. In some embodiments, the protective layer 118 is disposed on the spacer layer 116 and covers the sidewall of the spacer layer 116, where the upper insulating layer 122 is disposed on the pad 220*p* and extending part 220*e* of the conductive layer 220 and fills in the disconnection region D disposed on the sidewall of the spacer layer 116 to contact the protective layer 118 disposed on the sidewall of the spacer layer 116.

Figure 3:
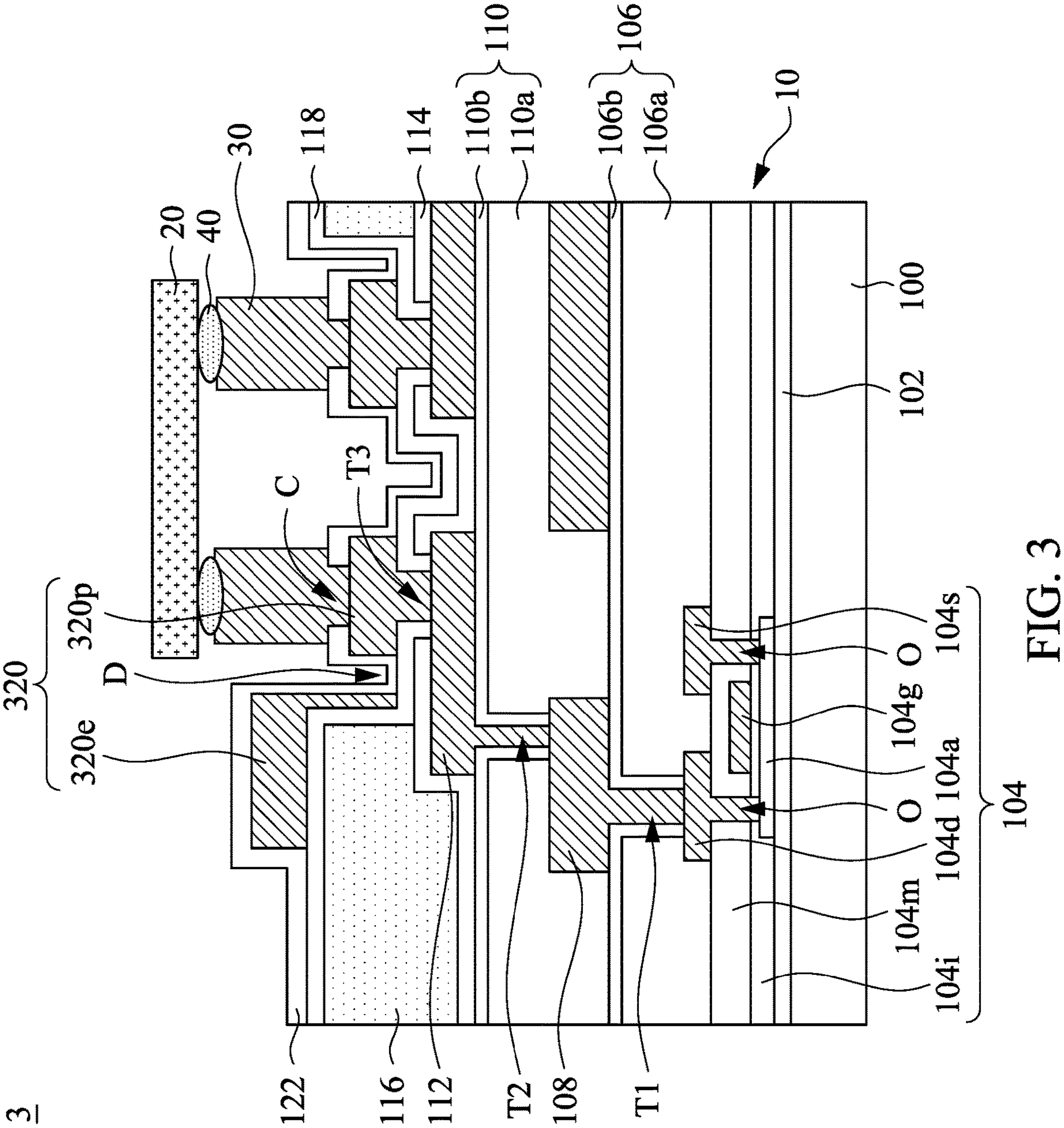
FIG. 3 is a schematic cross-sectional view of a display device according to at least another embodiment of the present disclosure.

FIG. 3 is a schematic cross-sectional view of a display device according to at least another embodiment of the present disclosure. The structures, the materials, the manufacturing processes and the relative positions of most elements in the embodiments of FIG. 3 and FIG. 2 are the same, so the same features are not repeated here. The difference between the embodiments of FIG. 3 and FIG. 2 is that the extending part 320*e* of the conductive layer 320 of the display device 3 in FIG. 3 is disposed on the spacer layer 116 and further extends to the sidewall of the spacer layer 116, and the pad 320*p* is disposed on the connecting layer 112 but does not extend to the sidewall of the spacer layer 116, where the disconnection region D is disposed between the pad 320*p* and the extending part 320*e*.

In detail, as shown in FIG. 3, the protective layer 118 is disposed on the spacer layer 116 and covers the sidewall of the spacer layer 116, and further extends to cover the upper surface of the connecting layer 112, where the upper insulating layer 122 is disposed on the pad 320*p* and the extending part 320*e* of the conductive layer 320, and fills in the disconnection region D disposed on the upper surface of the connecting layer 112 to contact the protective layer 118 disposed on the upper surface of the connecting layer 112.

Figure 4:
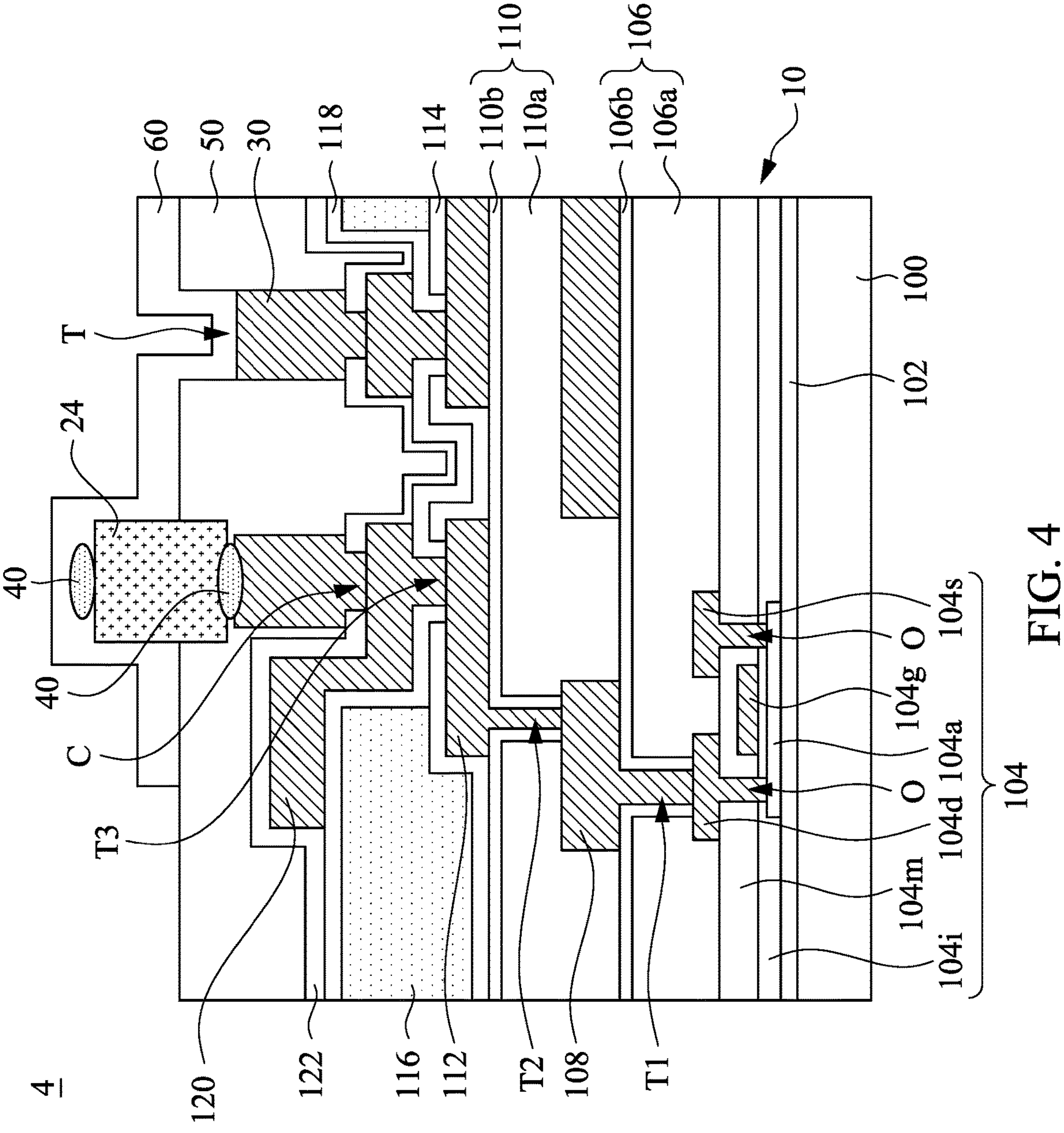
FIG. 4 is a schematic cross-sectional view of a display device according to at least another embodiment of the present disclosure.

FIG. 4 is a schematic cross-sectional view of a display device according to at least another embodiment of the present disclosure. The structures, the materials, the manufacturing processes and the relative positions of most elements in the embodiments of FIG. 4 and FIG. 1 are the same, so the same features are not repeated here. The difference between the embodiments of FIG. 4 and FIG. 1 is that the light emitting element 24 of the display device 4 of FIG. 4 is a vertical type light emitting element, while the light emitting element 20 of the display device 1 of FIG. 1 is a flip-chip type light emitting element.

In detail, as shown in FIG. 4, the light emitting element 24 has an upper surface and a lower surface opposite to the upper surface, the cathode (not shown) and the anode (not shown) of the light emitting element 24 are respectively disposed on the upper surface and the lower surface of the light emitting element 24, and the solders 40 are respectively disposed on the upper surface and the lower surface of the light emitting element 24. The display device 4 further includes a flat layer 50 and a transparent conductive layer 60. The flat layer 50 is disposed on the upper insulating layer 122 and has a through hole T exposing the soldering pad 30. The transparent conductive layer 60 is disposed on the flat layer 50 and extends to the upper surface of the light emitting element 24 to contact the solder 40 located on the upper surface of the light emitting element 24 then fills in the through hole T and contacts the soldering pads 30 to electrically connect the solder 40 and the soldering pad 30.

In summary, in at least one embodiment of the display device of the present disclosure, by disposing through holes for circuit connections in the orthographic projection area of the conductive layer connected to the solder pads in the array substrate, the conductive layer can shield the through holes to reduce the chance of the circuit connections in the through holes being damaged by laser, thereby improving the yield. In addition, by providing the spacer layer and extending the conductive layer on the spacer layer, the distance between the conductive layer and the through holes can be increased to further reduce the chance of the circuit connections in the through holes being damaged by laser, thereby improving the yield more effectively.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A display device, comprising:

a plurality of light emitting elements; and an array substrate, wherein the light emitting elements are disposed on the array substrate, and the array substrate comprises:

a substrate;

a plurality of switch elements, disposed on the substrate, wherein each of the switch elements comprises a source electrode and a drain electrode;

a first insulating layer, disposed on the source electrodes and the drain electrodes, and having a plurality of first through holes;

a wiring layer, disposed on the first insulating layer and connected to the switch elements through the first through holes;

a second insulating layer, disposed on the wiring layer and having a plurality of second through holes;

a connecting layer, disposed on the second insulating layer and connected to the wiring layer through the second through holes;

a third insulating layer, disposed on the connecting layer and having a plurality of third through holes;

a conductive layer, disposed on the third insulating layer and comprising a plurality of pads connected to the connecting layer through the third through holes;

an upper insulating layer, disposed on the pads and having a plurality of connecting vias, wherein the light emitting elements are disposed on the upper insulating layer and electrically connected to the pads through the connecting vias, and the light emitting elements are electrically connected to the switch elements; and a spacer layer, disposed between the third insulating layer and the conductive layer, wherein the conductive layer extends on the spacer layer, and the conductive layer is orthographically projected on the substrate to form a first orthographic projection area, wherein the second through holes are located in the first orthographic projection area, wherein each of the light emitting elements are orthographically projected on the substrate to form a second orthographic projection area, and the spacer layer is excluded from the second orthographic projection area.

2. The display device of claim 1, wherein the second through holes are not located in the second orthographic projection areas.

3. The display device of claim 1, wherein the first through holes are located in the first orthographic projection area.

4. The display device of claim 3, wherein the first through holes are not located in the second orthographic projection areas.

5. The display device of claim 1, wherein the spacer layer comprises an organic insulating layer.

6. The display device of claim 1, wherein the conductive layer further comprises a plurality of extending part not connected to the connecting layer and separated from the pads.

7. The display device of claim 1, wherein the array substrate further comprises a protective layer disposed between the spacer layer and the conductive layer, and the conductive layer is not directly in contact with the spacer layer.

8. The display device of claim 7, wherein the spacer layer has a sidewall located on the third insulating layer, and the protective layer is disposed on the spacer layer and covers the sidewall of the spacer layer.

9. The display device of claim 1, wherein at least one of the first insulating layer and the second insulating layer comprises an organic sub-layer and an inorganic sub-layer disposed on the organic sub-layer.

10. A display device, comprising:

a plurality of light emitting elements; and an array substrate, wherein the light emitting elements are disposed on the array substrate, and the array substrate comprises:

a substrate;

a plurality of switch elements, disposed on the substrate;

a insulating layer, disposed on the switch elements and having a plurality of through holes;

a connecting layer, disposed on the insulating layer and electrically connected to the switch elements through the through holes;

a conductive layer, disposed on the connecting layer and comprising a plurality of pads connected to the connecting layer, wherein the light emitting elements are electrically connected to the pads to electrically connect to the switch elements; and a spacer layer, disposed between the connecting layer and the conductive layer, wherein the conductive layer extends on the spacer layer, the conductive layer is orthographically projected on the substrate to form a first orthographic projection area, and each of the light emitting elements are orthographically projected on the substrate to form a second orthographic projection area, wherein the through holes are located in the first orthographic projection area and not located in the second orthographic projection areas, and the spacer layer is excluded from the second orthographic projection area.

11. The display device of claim 10, wherein the spacer layer comprises an organic insulating layer.

12. The display device of claim 10, wherein the conductive layer further comprises a plurality of extending part not connected to the connecting layer and separated from the pads.

13. The display device of claim 10, wherein the array substrate further comprises a protective layer disposed between the spacer layer and the conductive layer, and the conductive layer is not directly in contact with the spacer layer.

14. The display device of claim 13, wherein the spacer layer has a sidewall located on the insulating layer, and the protective layer is disposed on the spacer layer and covers the sidewall of the spacer layer.

15. The display device of claim 10, wherein the insulating layer comprises an organic sub-layer and an inorganic sub-layer disposed on the organic sub-layer.

* * * * *